(12) United States Patent
Jing

(10) Patent No.: US 10,301,175 B2
(45) Date of Patent: May 28, 2019

(54) METHOD FOR MANUFACTURING MEMS DOUBLE-LAYER SUSPENSION MICROSTRUCTURE, AND MEMS INFRARED DETECTOR

(71) Applicant: CSMC TECHNOLOGIES FAB1 CO., LTD., Jiangsu (CN)

(72) Inventor: Errong Jing, Jiangsu (CN)

(73) Assignee: CSMC TECHNOLOGIES FAB1 CO., LTD, Jiangsu (CN)

( * ) Notice: Subject to any disclaimer, the term of this patent is extended or adjusted under 35 U.S.C. 154(b) by 0 days.

(21) Appl. No.: 15/327,902

(22) PCT Filed: Aug. 20, 2015

(86) PCT No.: PCT/CN2015/087594
§ 371 (c)(1),
(2) Date: Jan. 20, 2017

(87) PCT Pub. No.: WO2016/086690
PCT Pub. Date: Jun. 9, 2016

(65) Prior Publication Data
US 2017/0203960 A1    Jul. 20, 2017

(30) Foreign Application Priority Data
Dec. 2, 2014   (CN) .......................... 2014 1 0723696

(51) Int. Cl.
*B81B 7/02* (2006.01)
*B81C 1/00* (2006.01)
(Continued)

(52) U.S. Cl.
CPC ................. *B81B 7/02* (2013.01); *B81C 1/00* (2013.01); *B81C 1/0015* (2013.01); *G01J 1/04* (2013.01);
(Continued)

(58) Field of Classification Search
CPC .............. B81B 7/02; B81B 2201/0278; B81B 2203/0118; B81C 1/00; B81C 1/0015;
(Continued)

(56) References Cited

U.S. PATENT DOCUMENTS 6,031,231 A * 2/2000 Kimata ..................... G01J 5/08
250/332
6,307,194 B1  10/2001 Fitzgibbons et al.
(Continued)

FOREIGN PATENT DOCUMENTS

CN          1603225 A     4/2005
CN        101367504 A     2/2009
(Continued)

*Primary Examiner* — Mark R Gaworecki
(74) *Attorney, Agent, or Firm* — Muncy, Geissler, Olds & Lowe, P.C.

(57) ABSTRACT

A method for manufacturing a MEMS double-layer suspension microstructure comprises steps of: forming a first film body on a substrate, and a cantilever beam connected to the substrate and the first film body; forming a sacrificial layer on the first film body and the cantilever beam; patterning the sacrificial layer located on the first film body to manufacture a recessed portion used for forming a support structure, the bottom of the recessed portion being exposed of the first film body; depositing a dielectric layer on the sacrificial layer; patterning the dielectric layer to manufacture a second film body and the support structure, the support structure being connected to the first film body and the second film body; and removing the sacrificial layer to obtain the MEMS double-layer suspension microstructure.

20 Claims, 3 Drawing Sheets

(51) Int. Cl.
*G01J 1/04* (2006.01)
*G01J 1/42* (2006.01)
*G01J 5/02* (2006.01)

(52) U.S. Cl.
CPC .................. *G01J 1/42* (2013.01); *G01J 5/024* (2013.01); *B81B 2201/0278* (2013.01); *B81B 2203/0118* (2013.01); *B81C 2201/0197* (2013.01)

(58) Field of Classification Search
CPC ....... B81C 2201/0197; G01J 1/04; G01J 1/42; G01J 5/024; G01J 5/0853
See application file for complete search history.

(56) References Cited

U.S. PATENT DOCUMENTS

| | | | |
|---|---|---|---|
| 6,329,738 B1 * | 12/2001 | Hung | B81B 3/0037 310/309 |
| 6,813,059 B2 * | 11/2004 | Hunter | G02B 26/0841 359/231 |
| 9,102,517 B2 * | 8/2015 | Maling | H01L 29/84 |
| 2002/0179837 A1 | 12/2002 | Ray | |
| 2003/0129824 A1 | 7/2003 | Liu | |
| 2005/0116169 A1 * | 6/2005 | Tohyama | G01J 5/20 250/338.1 |
| 2006/0131697 A1 | 6/2006 | Wu et al. | |

FOREIGN PATENT DOCUMENTS

| | | |
|---|---|---|
| CN | 101475137 | 7/2009 |
| CN | 101545809 A | 9/2009 |
| CN | 101570311 A | 11/2009 |
| CN | 102353459 A | 2/2012 |
| CN | 102393251 A | 3/2012 |
| CN | 102393252 A | 3/2012 |
| CN | 102543591 A | 7/2012 |
| CN | 103569946 A | 2/2014 |
| CN | 103759838 A | 4/2014 |
| JP | 2001215151 A | 8/2001 |
| JP | 2005116856 A | 4/2005 |
| JP | 2014170994 A | 9/2014 |

* cited by examiner

METHOD FOR MANUFACTURING MEMS DOUBLE-LAYER SUSPENSION MICROSTRUCTURE, AND MEMS INFRARED DETECTOR

FIELD OF THE INVENTION

The invention relates to semiconductors, and more particular, relates to a method of manufacturing a MEMS double-layer suspension microstructure and a MEMS infrared detector.

BACKGROUND OF THE INVENTION

MEMS (Micro Electro Mechanical Systems) is a minimized integrated system which adopts an integrated circuit manufacture technology and a micro-process technology to manufacture a microstructure, a micro-sensor, a micro-actuator, a control and process circuit, and even an interface and a power source on one or multiple chip. Compared to conventional infrared detector, the infrared detector manufactured by using a MEMS technology possesses significant advantages at aspects such as the volume, power consumption, weight, and cost. At present, the infrared detector manufactured by using a MEMS technology is extensively applied to military fair and civil field. According to a difference of working principle, the infrared detector mainly includes a thermo-electric pile detector, a pyroelectricity detector and a thermo-sensitive resistance detector. The thermo-electric pile detector takes advantage of Seebeck effect to transfer a temperature variation caused by an infrared radiation into a voltage signal output. The pyroelectricity infrared detector takes advantage of charge accumulation in a heated body to detect a temperature variation caused by an infrared radiation. The thermo-sensitive resistance infrared detector takes advantage of reading a resistance value to detect a temperature variation caused by an infrared radiation. At present, MEMS infrared detector generally adopts a single-layer suspension microstructure, the technology is simple. However, when a size of the infrared detector chip is reduced, the suspension absorbing region (a film-like absorb layer) servings for absorbing the infrared radiation is reduced at the same time, thus the infrared response rate is reduced greatly.

SUMMARY

Therefore, it is necessary to provide a method of manufacturing a MEMS double-layer suspension microstructure which can manufacture an infrared detector having a high infrared response rate. Moreover, a MEMS infrared detector is provided.

A method of manufacturing a MEMS double-layer suspension microstructure includes the steps: providing a substrate; forming a first sacrificial layer on the substrate; patterning the first sacrificial layer; depositing a first dielectric layer on the first sacrificial layer; patterning the first dielectric layer to form a first film body on the first sacrificial layer, and a cantilever beam connecting the substrate and the first film body; forming a second sacrificial layer on the first dielectric layer; patterning the second sacrificial layer located on the first film body to manufacture a recessed portion configured to form a support structure, a bottom of the recessed portion exposing the first film body; depositing a second dielectric layer on the second sacrificial layer; patterning the second dielectric layer to manufacture a second film body and the support structure, the support structure connecting the first film body and the second film body; and removing the first sacrificial layer and the second sacrificial layer to obtain a MEMS double-layer suspension microstructure.

Another method of manufacturing a MEMS double-layer suspension microstructure includes the steps: forming a first film body on a substrate, and forming a cantilever beam connecting the substrate and the first film body; forming a sacrificial layer on the first film body and the cantilever beam; patterning the sacrificial layer located on the first film body to manufacture a recessed portion configured to form a support structure, a bottom of the recessed portion exposing the first film body; depositing a dielectric layer on the sacrificial layer; patterning the dielectric layer to manufacture a second film body and the support structure, the support structure connecting the first film body and the second film body; and removing the sacrificial layer to obtain a MEMS double-layer suspension microstructure.

A MEMS infrared detector includes a MEMS double-layer suspension microstructure, wherein the MEMS double-layer suspension microstructure includes: a substrate; a first film body on the substrate; a cantilever beam connecting the substrate and the first film body; a second film body on the first film body; and a support structure connecting the first film body and the second film body.

Above method of manufacturing a MEMS double-layer suspension microstructure can manufacture a double-layer suspension microstructure, the infrared detector manufactured by the double-layer suspension microstructure (the suspension microstructure having a first dielectric layer and a second dielectric layer), because there is no need to manufacture a cantilever beam on the second dielectric layer, thus the second dielectric layer can be manufactured greater than the first dielectric layer, therefore, it possesses a larger suspension absorbing region than that of an infrared detector having a single layer suspension microstructure, thereby an infrared response rate is greatly increased when compared to a conventional infrared detector having a single layer suspension microstructure. When a size of the infrared detector chip is reduced, compared to a conventional infrared detector having a single layer suspension microstructure, even if the suspension region (the second dielectric layer) used for absorbing infrared radiation can be reduced accordingly, however, because there is no need to manufacture a cantilever beam on the second dielectric layer, thus the second dielectric layer can be manufactured greater than the first dielectric layer, therefore, even if the size of the infrared detector chip is reduced, it can also possess a larger suspension absorbing region than that of the infrared detector having a single layer suspension microstructure, the infrared response rate is greatly increased when compared to the conventional infrared detector having a single layer suspension microstructure.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Figure 1:
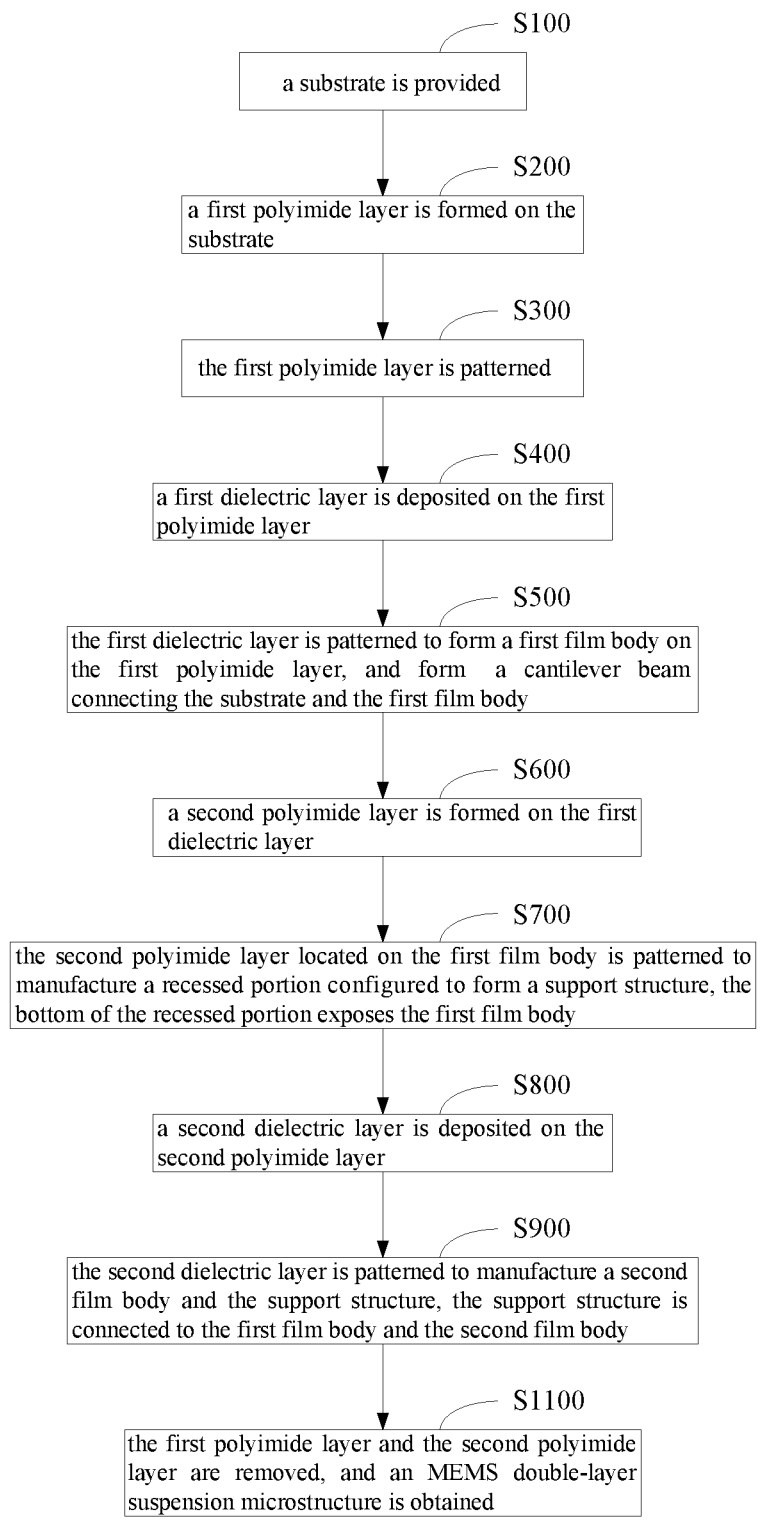
FIG. 1 is a flow chart of a method of manufacturing a MEMS double-layer suspension microstructure according to an embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

Unless otherwise defined, all terms used herein have the same meaning as commonly understood by one of ordinary skill in the art to which this invention belongs. Terms in the description of the invention are for the purpose of describing specific embodiments, and are not intend to limit the invention. As used herein, the term "and/or" includes any and all combinations of one or more of the associated listed items.

FIG. 1 is a flow chart of a method of manufacturing a MEMS double-layer suspension microstructure according to an embodiment. In the embodiment, the first sacrificial layer and/or the second sacrificial layer are polyimide layers.

A method of manufacturing a MEMS double-layer suspension microstructure includes steps as follows:

In step S100, a substrate 100 is provided. The substrate 100 should be a substrate with a circuit structure layout.

In step S200, a first polyimide layer 200 is formed on the substrate 100. The first polyimide layer 200 is formed by coating, the first polyimide layer 200 has a thickness ranging from 500 nanometers to 3000 nanometers.

Figure 2:
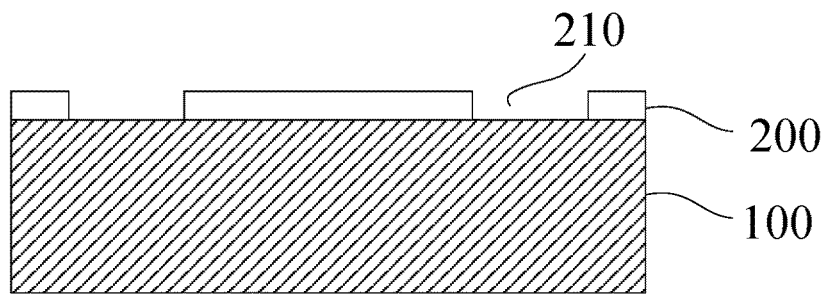
FIG. 2 is a structural view of a first polyimide layer after patterning.

In step S300, the first polyimide layer 300 is patterned. Referring to FIG. 2, the etched region 210 is employed to form a dielectric layer and a connecting region of the substrate.

In step S400, a first dielectric layer 300 is deposited on the first polyimide layer 200. The first dielectric layer 300 has a thickness ranging from 100 nanometers to 2000 nanometers. The first dielectric layer 300 is made of silicon dioxide, silicon nitride, silicon oxynitride or a combination of two laminated layers of above materials or a combination of three laminated layers of above materials, i.e. the first dielectric layer 300 can be a single layer structure of silicon dioxide, silicon nitride, or silicon oxynitride, and also can be a non single layer structure of a combination of two laminated layers of above materials or a combination of three laminated layers of above materials.

Figure 3:
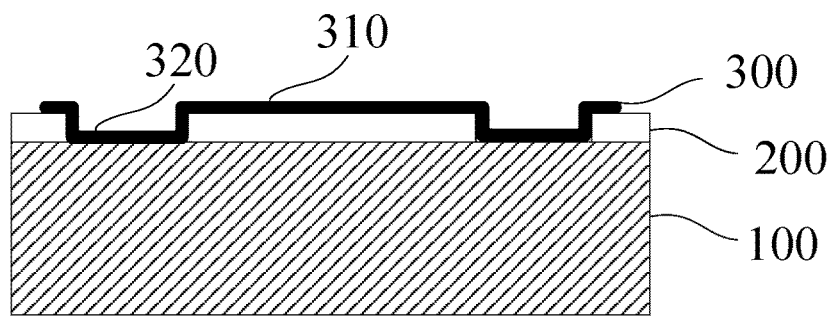
FIG. 3 is a structural view of a manufactured first film body and a cantilever beam.
Figure 4:
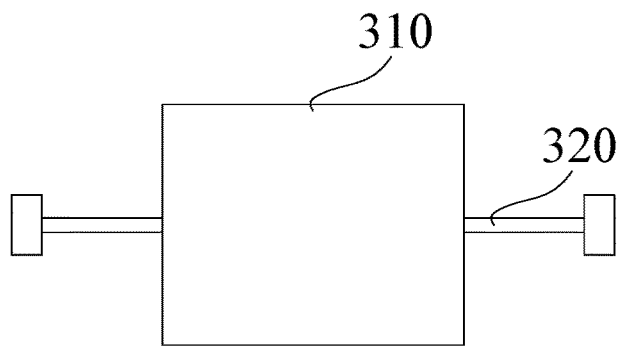
FIG. 4 is a top view of a manufactured first film body and a cantilever beam.

In step S500, the first dielectric layer 300 is patterned to form a first film body 310 on the first polyimide layer 200, and form a cantilever beam 320 connecting the substrate 100 and the first film body 310. Referring to FIG. 3 and FIG. 4, in the embodiment the number of the cantilever beam 320 is two, the two cantilever beams 320 are located on opposite sides of the first film body 310. The cantilever beam 320 is very tiny, a contact area between the cantilever beam 320 and the substrate 100 is much less than that of the infrared absorbing region (it is the first film body 310 herein), avoiding a fast absorption of the infrared energy by the substrate 100. The first film body 310 is fixed to the substrate 100 by the first polyimide layer 200.

For one skilled in the art, in addition to above method, the single layer suspension microstructure has other well known manufacturing method, thus in alternative embodiments, other methods can also be adopted to form the first film body 310 on the substrate 100, and form the cantilever beam 320 connecting the substrate 100 and the first film body 310.

In steps S600, a second polyimide layer 400 is formed on the first dielectric layer 400. The second polyimide layer 400 is formed by coating, and the second polyimide layer 400 has a thickness ranging from 500 nanometers to 3000 nanometers.

Figure 5:
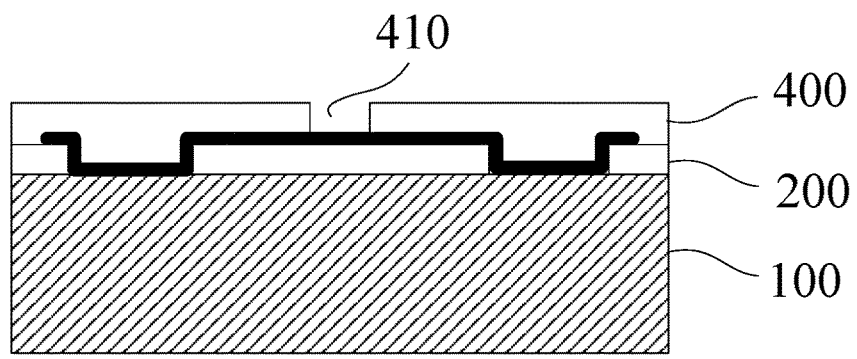
FIG. 5 is a perspective view of a manufactured recessed portion.
Figure 6:
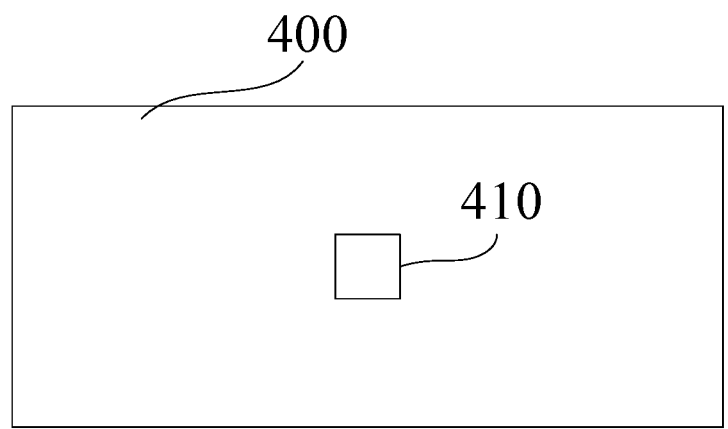
FIG. 6 is a top view of a manufactured recessed portion.

In step S700, the second polyimide layer 400 located on the first film body 310 is patterned to manufacture a recessed portion 410 configured to form a support structure 520, the bottom of the recessed portion 410 exposes the first film body 310. Referring to FIG. 5 and FIG. 6, in the illustrated embodiment, the number of the recessed portion 410 is one, the recessed portion 410 is exposed above the first film body 310 and located on a central position of the second polyimide layer 400.

In step S800, a second dielectric layer 500 is deposited on the second polyimide layer 400. The second dielectric layer 500 has a thickness ranging from 100 nanometers to 2000 nanometers. The second dielectric layer 500 is made of silicon dioxide, silicon nitride, silicon oxynitride or a combination of two laminated layers of above materials or a combination of three laminated layers of above materials, i.e. the second dielectric layer 500 can be a single layer structure of silicon dioxide, silicon nitride, or silicon oxynitride, and also can be a non single layer structure of a combination of two laminated layers of above materials or a combination of three laminated layers of above materials.

Figure 7:
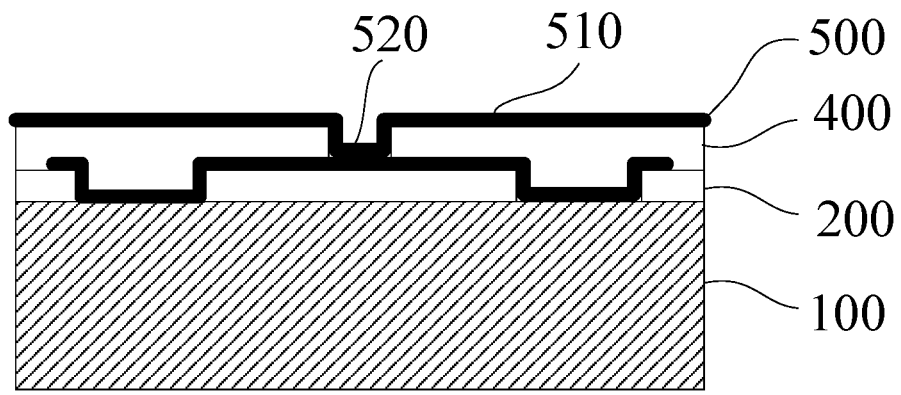
FIG. 7 is a perspective view of a manufactured second film body and a support structure.

In step S900, the second dielectric layer 500 is patterned to manufacture a second film body 510 and the support structure 520, the support structure 520 is connected to the first film body 310 and the second film body 510. The dielectric layer deposited on the recessed portion 410 of the second polyimide layer 400 is patterned and serves as the support structure 520, a peripheral region connected to the support structure 520 forms the second film body 510. Referring to FIG. 7, because there is no need to manufacture a cantilever beam on the second dielectric layer 500, thus a projection area of the second film body 510 on the surface of the substrate 100 can be fabricated greater than a projection area of the first film body 310 on the substrate 100. The second film body 510 is fixed to the first film body 310 by the second polyimide layer 400.

Figure 8:
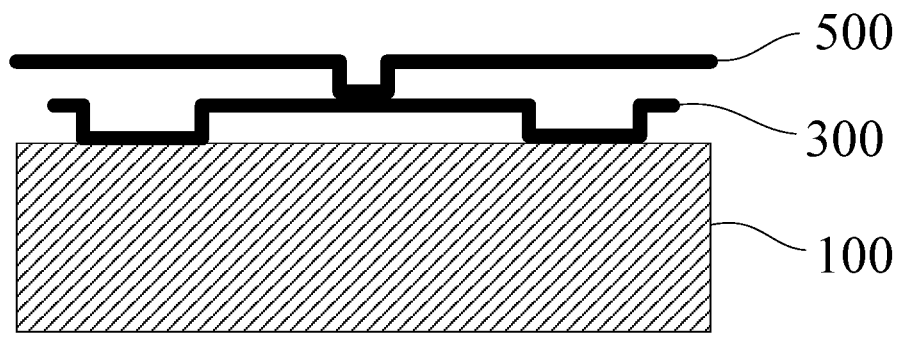
FIG. 8 is a perspective view after a first polyimide layer and a second polyimide layer being removed.

In step S1100, the first polyimide layer 200 and the second polyimide layer 400 are removed, and a MEMS double-layer suspension microstructure is obtained, referring to FIG. 8. The first polyimide layer 200 and the second polyimide layer 400 are removed by using an oxygen ion dry etching technology, and a MEMS double-layer suspension microstructure is obtained. The working principle of the oxygen ion dry etching technology is that, a little oxygen is filled into a vacuum system, and a high voltage is applied to ionize the oxygen, thereby forming a glow column of oxygen plasma. The active oxygen can oxidize the polyimide quickly and generates a volatile gaseous, thereby achieving an etching process. The first polyimide layer 200 and the second polyimide layer 400 are regarded as sacrificial layers in the method. In the alternative embodiment, any other material which can be removed by semiconductor etching technology can substitute the sacrificial layer in the method. The semiconductor etching technology certainly includes an etching technology adopting gas or light to etch, for example an oxygen ion dry etching technology.

In a MEMS infrared detector manufactured by above MEMS double-layer suspension microstructure, both the first film body 310 and the second film body 510 (mainly depend on the second film body 510) can be employed to absorb the film-like absorbing layer for absorbing infrared radiation, the electric signal transferred by the absorbed infrared energy is transmitted to the circuit structure of first substrate 100 via the cantilever beam 320.

The invention further discloses a MEMS infrared detector, the MEMS double-layer suspension microstructure can be manufactured by above method of manufacturing a MEMS double-layer suspension microstructure. Also referring to FIG. 8, FIG. 4, and FIG. 7, the MEMS double-layer microstructure includes a substrate 100, a first film body 310 on the substrate 100, and a cantilever beam 320 connecting the substrate 100 and the first film body 310, a second film body 510 on the first film body 310, and a support structure 520 connecting the first film body 310 and the second film body 510. The MEMS infrared detector can be thermosensitive resistance infrared detector.

Above method of manufacturing a MEMS double-layer suspension microstructure can manufacture a double-layer suspension microstructure, the infrared detector manufactured by the double-layer suspension microstructure (the suspension microstructure having a first dielectric layer and a second dielectric layer), because there is no need to manufacture a cantilever beam on the second dielectric layer, thus the second dielectric layer can be manufactured greater than the first dielectric layer, therefore, it possesses a larger suspension absorbing region than that of an infrared detector having a single layer suspension microstructure, thereby an infrared response rate is greatly increased when compared to a conventional infrared detector having a single layer suspension microstructure. When a size of the infrared detector chip is reduced, compared to a conventional infrared detector having a single layer suspension microstructure, even if the suspension region (the second dielectric layer) used for absorbing infrared radiation can be reduced accordingly, however, because there is no need to manufacture a cantilever beam on the second dielectric layer, thus the second dielectric layer can be manufactured greater than the first dielectric layer, therefore, even if the size of the infrared detector chip is reduced, it can also possess a larger suspension absorbing region than that of the infrared detector having a single layer suspension microstructure, the infrared response rate is greatly increased when compared to the conventional infrared detector having a single layer suspension microstructure.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A method of manufacturing a MEMS double-layer suspension microstructure, comprising:
   providing a substrate;
   forming a first sacrificial layer on the substrate;
   patterning the first sacrificial layer;
   depositing a first dielectric layer on the first sacrificial layer;
   patterning the first dielectric layer to form a first film body on the first sacrificial layer, and a cantilever beam connecting the substrate and the first film body;
   forming a second sacrificial layer on the first dielectric layer;
   patterning the second sacrificial layer located on the first film body to manufacture a recessed portion configured to form a support structure, a bottom of the recessed portion exposing the first film body;
   depositing a second dielectric layer on the second sacrificial layer;
   patterning the second dielectric layer to manufacture a second film body and the support structure, the support structure connecting the first film body and the second film body; and
   removing the first sacrificial layer and the second sacrificial layer to obtain a MEMS double-layer suspension microstructure,
   wherein the first film body is entirely covered by the second film body.

2. The method according to claim 1, wherein the first sacrificial layer and/or the second sacrificial layer are polyimide layers.

3. The method according to claim 1, wherein both the first sacrificial layer and the second sacrificial layer has a thickness ranging from 500 nanometers to 3000 nanometers.

4. The method according to claim 1, wherein both the first dielectric layer and the second dielectric layer has a thickness ranging from 100 nanometers to 2000 nanometers.

5. The method according to claim 1, wherein the first dielectric layer and the second dielectric layer are made of silicon dioxide, silicon nitride, silicon oxynitride, or a combination of two laminated layers of above materials, or a combination of three laminated layers of above materials.

6. The method according to claim 1, wherein a number of the cantilever beam is two, the two cantilevers are located on opposite sides of the first film body.

7. The method according to claim 1, wherein a number of the recessed portion is one, the recessed portion is exposed above the first film body and located on a central position of the second sacrificial layer.

8. The method according to claim 1, wherein a projection area of the second film body on a surface of the substrate is larger than a projection area of the first film body on the substrate.

9. The method according to claim 1, wherein in the step of removing the first sacrificial layer and the second sacrificial layer, the first sacrificial layer and the second sacrificial layer are removed by using an oxygen ion dry etching technology, and the MEMS double-layer suspension microstructure is obtained.

10. A method of manufacturing a MEMS double-layer suspension microstructure, comprising:
    forming a first film body on a substrate, and forming a cantilever beam connecting the substrate and the first film body;
    forming a sacrificial layer on the first film body and the cantilever beam;

patterning the sacrificial layer located on the first film body to manufacture a recessed portion configured to form a support structure, a bottom of the recessed portion exposing the first film body;

depositing a dielectric layer on the sacrificial layer;

patterning the dielectric layer to manufacture a second film body and the support structure, the support structure connecting the first film body and the second film body; and removing the sacrificial layer to obtain a MEMS double-layer suspension microstructure, wherein the first film body is entirely covered by the second film body.

11. The method according to claim 10, wherein the sacrificial layer is a polyimide layer.

12. The method according to claim 10, wherein the dielectric layer is made of silicon dioxide, silicon nitride, silicon oxynitride or a combination of two laminated layers of above materials or a combination of three laminated layers of above materials.

13. The method according to claim 10, wherein a projection area of the second film body on a surface of the substrate is greater than a projection area of the first film body on the substrate.

14. The method according to claim 10, wherein in the step of removing the sacrificial layer, the sacrificial layer is removed by using an oxygen ion dry etching technology, and the MEMS double-layer suspension microstructure is obtained.

15. A MEMS infrared detector, comprising a MEMS double-layer suspension microstructure, wherein the MEMS double-layer suspension microstructure comprises:

a substrate;

a first film body on the substrate;

a cantilever beam connecting the substrate and the first film body;

a second film body on the first film body; and a support structure connecting the first film body and the second film body, wherein the first film body and the cantilever beam are configured to absorb infra-red light.

16. The MEMS infrared detector according to claim 15, wherein a number of the cantilever beam is two, the two cantilevers are located on opposite sides of the first film body.

17. The MEMS infrared detector according to claim 15, wherein a number of the support structure is one, the support structure is located on a central position of the second film body.

18. The MEMS infrared detector according to claim 15, wherein the first film body and the second film body are made of silicon dioxide, silicon nitride, silicon oxynitride or a combination of two laminated layers of above materials or a combination of three laminated layers of above materials.

19. The MEMS infrared detector according to claim 15, wherein both the first film body and the second film body have a thickness ranging from 100 nanometers to 2000 nanometers.

20. The MEMS infrared detector according to claim 15, wherein a projection area of the second film body on a surface of the substrate is larger than a projection area of the first film body on the substrate.

* * * * *